United States Patent [19]

Craft et al.

[11] Patent Number: 5,139,959
[45] Date of Patent: Aug. 18, 1992

[54] METHOD FOR FORMING BIPOLAR TRANSISTOR INPUT PROTECTION

[75] Inventors: Scott L. Craft, Phoenix; Stephen P. Robb, Tempe; Paul W. Sanders, Scottsdale, all of Ariz.

[73] Assignee: Motorola, Inc., Schaumburg, Ill.

[21] Appl. No.: 822,804

[22] Filed: Jan. 21, 1992

[51] Int. Cl.⁵ .......................................... H01L 21/265
[52] U.S. Cl. ....................................... 437/31; 437/60; 437/904; 437/918; 148/DIG. 11
[58] Field of Search ................... 437/31, 60, 904, 918, 437/51; 148/DIG. 10, DIG. 11; 357/23.13

[56] References Cited

U.S. PATENT DOCUMENTS

| | | | |
|---|---|---|---|
| 4,616,404 | 10/1986 | Wang et al. | 437/904 |
| 4,897,757 | 1/1990 | Tailliet et al. | 357/23.13 |
| 5,010,380 | 4/1991 | Avery | 357/23.13 |
| 5,045,483 | 9/1991 | Delong et al. | 437/31 |

FOREIGN PATENT DOCUMENTS 0064466 11/1982 European Pat. Off. .............. 437/60
2090701 7/1982 United Kingdom .............. 357/23.13

Primary Examiner—Brian E. Hearn
Assistant Examiner—Tuan Nguyen
Attorney, Agent, or Firm—Joe E. Barbee

[57] ABSTRACT

A protective circuit for an input to a bipolar transistor (10) capable of operating in the microwave frequency range. In a first embodiment, a polysilicon diode (24) is connected across a base-emitter junction of the bipolar transistor (10). In a second embodiment, a polysilicon resistor (38) is connected in series with an emitter of the bipolar transistor (10), and the polysilicon diode (24) is connected across the series combination of the base-emitter junction and the polysilicon resistor (38). The layout of the transistor (10) and the islands of polysilicon (23, 25) housing the diode is critical since the bipolar transistor (10) is capable of operating in the microwave frequency range. In a first layout, an island of polysilicon (25) is centered between two transistor regions (47 and 48). In an exterior diode layout, a transistor region (51) is centered between two islands of polysilicon (23 and 25).

14 Claims, 7 Drawing Sheets

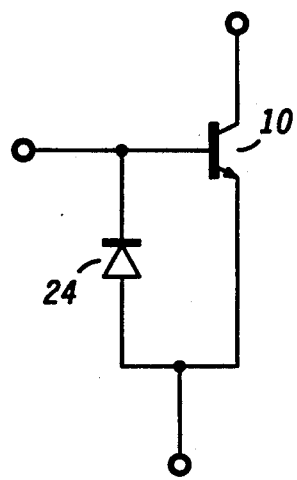
FIG. 7
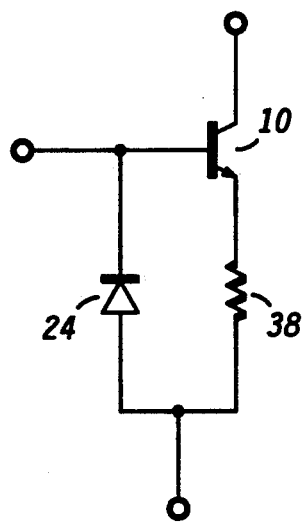
FIG. 8
FIG. 9
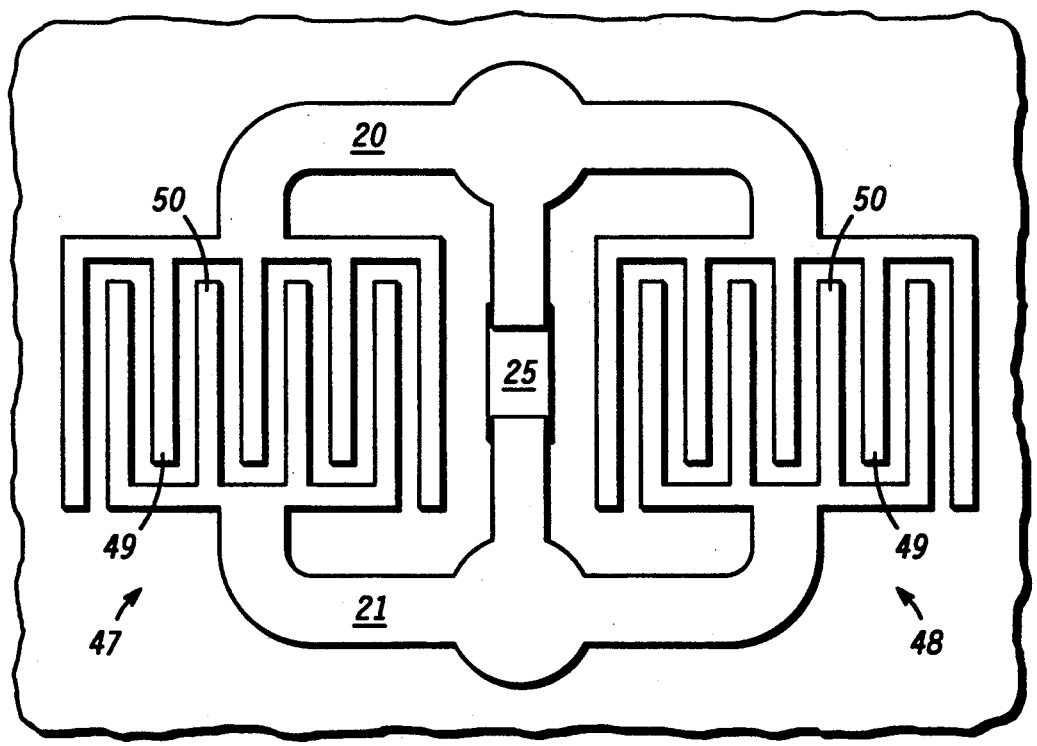

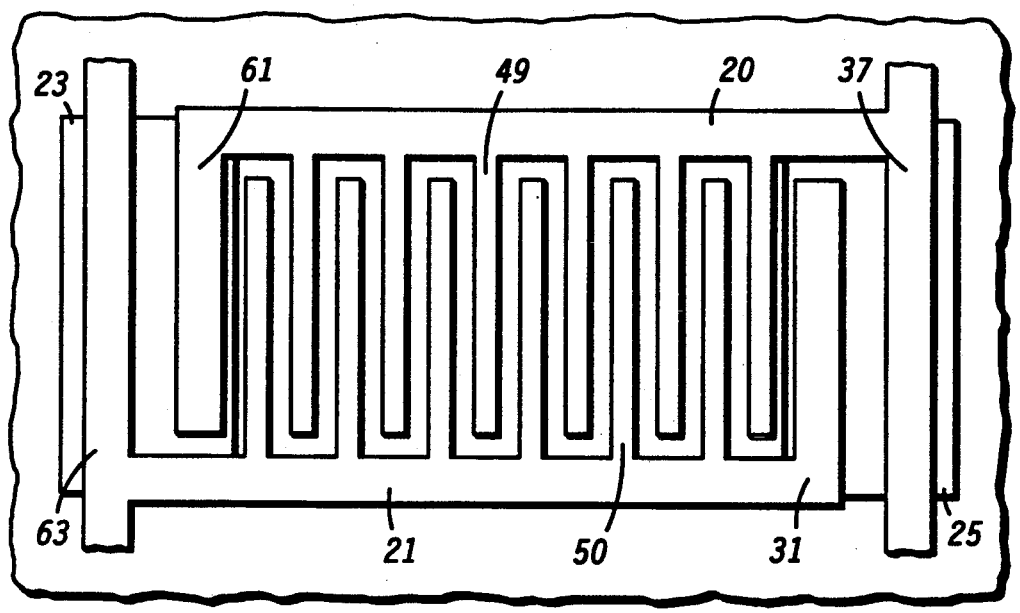
FIG. 10
FIG. 11
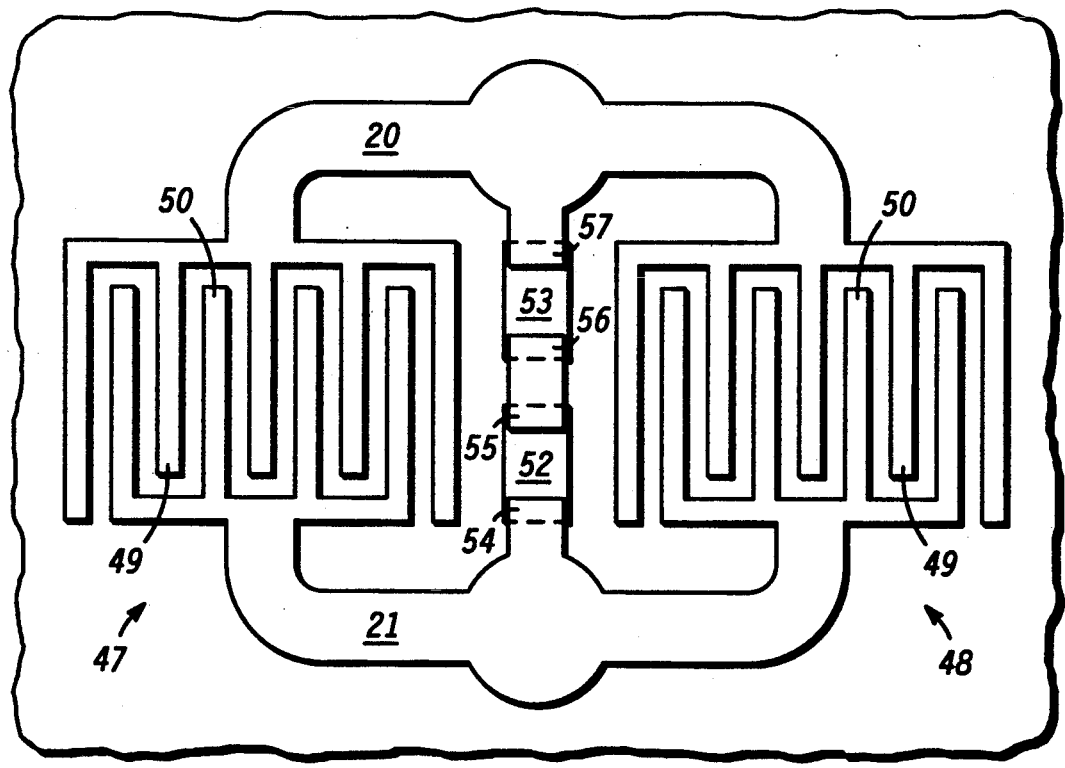

METHOD FOR FORMING BIPOLAR TRANSISTOR INPUT PROTECTION

BACKGROUND OF THE INVENTION

This invention relates, in general, to bipolar transistors, and more particularly to bipolar transistors capable of operating in the microwave frequency range.

A typical bipolar transistor failure mode is degradation of the transistor current gain, commonly referred to as the transistor beta. The primary cause of beta degradation in a bipolar transistor is avalanche breakdown of the emitter-base junction due to operation of this junction under reverse bias conditions. Although operation under these conditions is not necessarily catastrophic to the transistor, the degradation in the value of beta may adversely affect small signal parameters such as transconductance and input resistance.

Most small signal parameters of a bipolar transistor amplifier are a function of the dc current in the emitters of these devices. Further, the dc emitter current in these devices is a function of beta. Therefore, beta degradation alters small signal parameters of bipolar transistors by changing the dc emitter current in the transistor. The degradation of beta will result in increased distortion, increased noise figure and ultimately in the reduction of the amplifier's gain.

Accordingly, it would be advantageous to have a beta degradation hardened bipolar transistor circuit capable of handling transients or intentional overvoltages appearing at the input. Beta degradation hardened transistors receiving excessive voltage levels at their inputs would be more reliable and require less frequent replacement. Finally, it would be advantageous that the beta degradation hardened transistors have device characteristics equal to or better than those of bipolar transistors currently available.

SUMMARY OF THE INVENTION

Briefly stated, the present invention is a method for forming an input protection circuit for a bipolar transistor capable of operating in the microwave frequency range. A fabrication process for a bipolar transistor is modified to include a polysilicon diode. Prior to formation of a base region of the bipolar transistor, an island of polysilicon is formed over an insulating layer. The polysilicon diode is formed in the island of polysilicon. A first conductor of the polysilicon diode is formed simultaneously with a base contact area of the bipolar transistor. A second conductor of the polysilicon diode is formed simultaneously with an emitter area of the bipolar transistor. The first conductor is coupled to the emitter area of the bipolar transistor and the second conductor is coupled to the base contact area of the bipolar transistor. The bipolar transistor has a bottom collector electrode.

BRIEF DESCRIPTION OF THE DRAWINGS

FIG. 7 shows a circuit schematic of the embodiment of FIG. 5;

FIG. 8 shows a circuit schematic of the embodiment of FIG. 6;

FIG. 9 is a simplified top view illustrating a first layout of an embodiment of the present invention having a single polysilicon diode;

FIG. 10 is a simplified top view illustrating a second layout of an embodiment of the present invention having a single polysilicon diode;

FIG. 11 is a simplified top view illustrating the first layout shown in FIG. 9 having two polysilicon diodes for input protection.

DETAILED DESCRIPTION OF THE DRAWINGS

Figure 1:
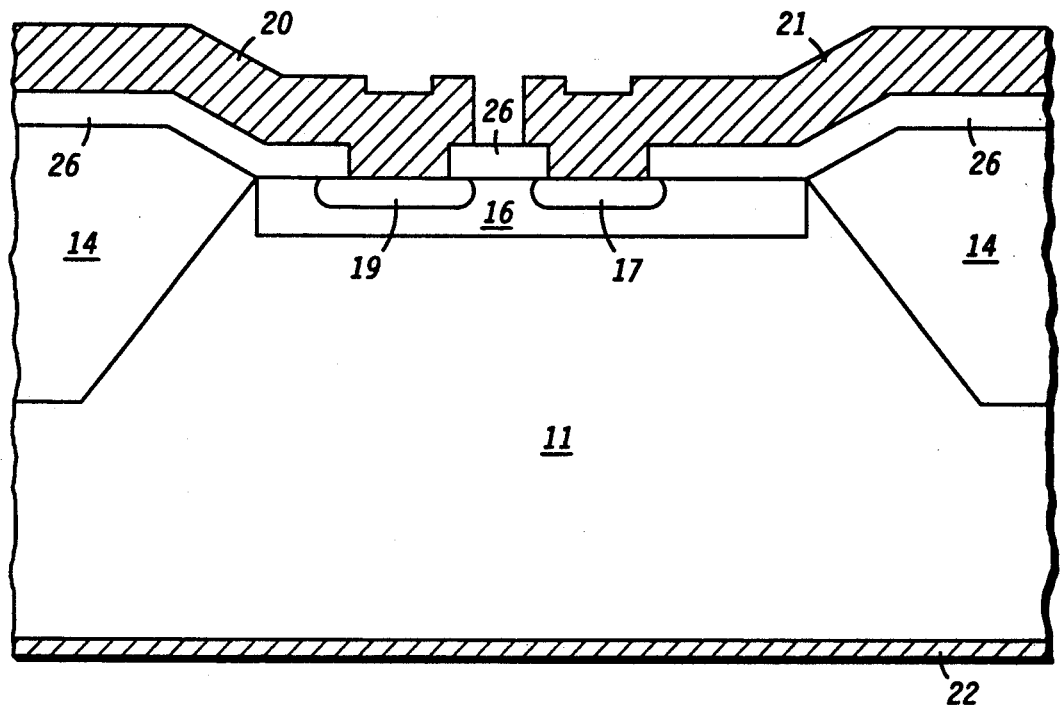
FIG. 1 is a highly enlarged cross-sectional view of a portion of a prior art bipolar transistor.

In a prior art bipolar transistor shown in FIG. 1, a substrate 11 has a base region 16 formed therein. Base region 16 is laterally isolated from other areas in substrate 11 by an insulating layer 14. Preferably, insulating layer 14 is a field oxide. An emitter area 17 is formed in base region 16. A highly doped area 19 is formed in base region 16 and serves as a base contact area. A dielectric layer 26 covers substrate 11 and has openings over base contact area 19 and emitter area 17. A base electrode 20 makes contact to base contact area 19, and an emitter electrode 21 makes contact to emitter area 17. Dielectric layer 26 serves to isolate base electrode 20 and emitter electrode 21 from any underlying structures. A collector electrode 22 makes contact to a backside surface of substrate 11.

Preferably, substrate 11 is silicon having an N conductivity type. In accordance with substrate 11 of N conductivity type, base region 16 is P conductivity type and emitter area 17 is N+ conductivity type. Moreover, base contact area 19 is P+ conductivity type.

Although an NPN bipolar transistor is disclosed herein, it shall be understood that the present invention may be realized using a PNP bipolar transistor. In a first embodiment, input protection to bipolar transistor 10 of FIG. 1 is achieved by coupling a polysilicon diode 24 across a base-emitter junction of bipolar transistor 10 (shown in FIG. 5). Formation of polysilicon diode 24 is incorporated into a standard process used to fabricate bipolar transistor 10 as will become apparent hereinafter by reference to FIGS. 2-5.

Figure 2:
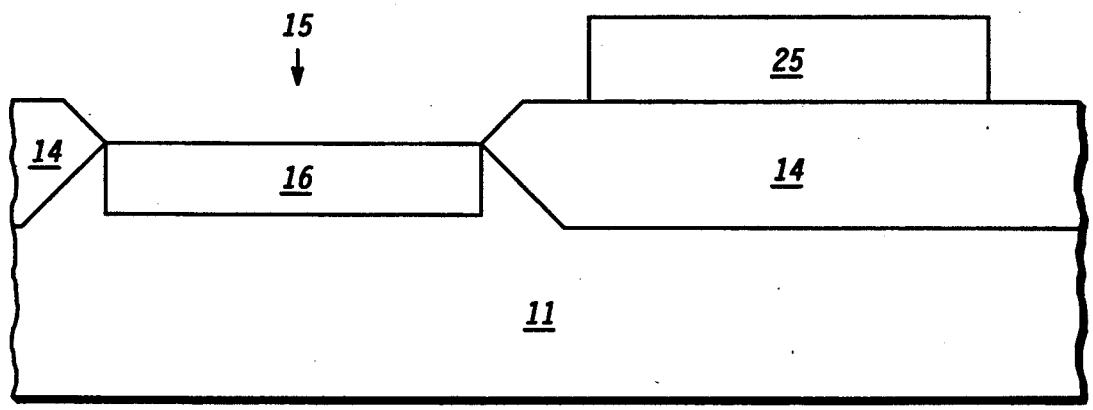
FIGS. 2-4 illustrate highly enlarged cross-sectional views of a portion of the bipolar transistor with the input protection device of FIG. 5.
Figure 3:
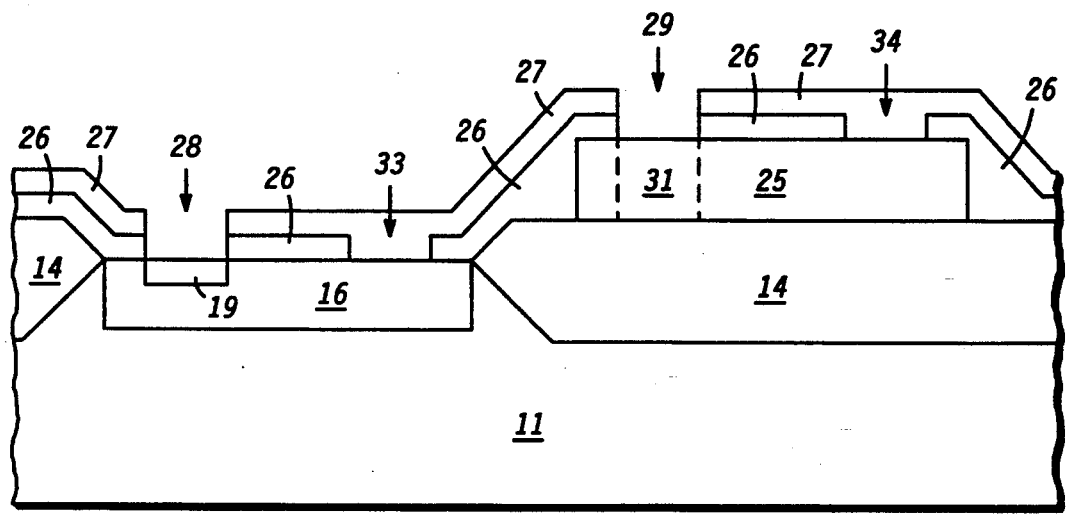

Now referring to FIG. 2, the present invention incorporates the step of laterally isolating areas in substrate 11 by field oxide 14. A layer of polysilicon is formed over field oxide 14. The layer of polysilicon is patterned to expose portions of field oxide 14 thereby forming a plurality of islands of polysilicon. A single island of polysilicon 25 is shown in FIG. 3. Preferably, the island of polysilicon is doped with a first impurity material wherein the first impurity material may be, for example, boron having a concentration less than about $10^{20}$ atoms per cubic centimeter.

In a subsequent doping step, the first impurity material is provided through a gap 15 or opening 15 in field oxide 14, conveniently by ion implantation, to form base region 16. In addition, the second impurity material dopes the island of polysilicon 25 a second time. Preferably, the concentration of the first impurity material for the subsequent doping step is less than about $10^{19}$ atoms per cubic centimeter. It shall be understood that doping the island of polysilicon 25 a second time is not required for enablement of the present invention.

Now referring to FIG. 3, dielectric 26 is formed over exposed portions of semiconductor substrate 11, insulating material 14, and island of polysilicon 25. Dielectric 26, consisting for example of silicon dioxide or nitride, is etched using means well known in the art to provide a first master set of openings 28, 29, 33, and 34. Openings 28 and 29 form a first subset of openings and openings 33 and 34 form a second subset of openings of the first master set of openings 28, 29, 33, and 34. FIG. 3 shows openings 33 and 34 filled with a first block-out mask 27. Opening 28 exposes a first portion of bipolar transistor base region 16 and opening 29 exposes a first portion of island of polysilicon 25. Opening 33 exposes an emitter area 17 in base region 16 and opening 34 exposes a diode cathode region 37 in a second portion of island of polysilicon 25 as is more clearly illustrated in FIG. 4. First master set of openings 28, 29, 33, and 34 serve as master-mask openings for the remainder of the fabrication steps and, since they are formed at the same time, are self-aligned.

The first block-out mask 27, of for example photoresist, is formed over dielectric 26 including the first master set of openings 28, 29, 33, and 34. However, as shown in FIG. 3, portions of the first block-out mask are removed from first subset of openings 28 and 29; thereby, uncovering the first portion of bipolar transistor base region 16 and the first portion of the island of polysilicon 25. The first impurity material is provided in the first portion of base region 16 and the first portion of island of polysilicon 25, thereby forming base contact area 19 and diode anode region 31, respectively. Diode anode region 31 is shown by dotted lines. The first impurity material, of for example boron, may be provided by ion implantation.

Figure 4:
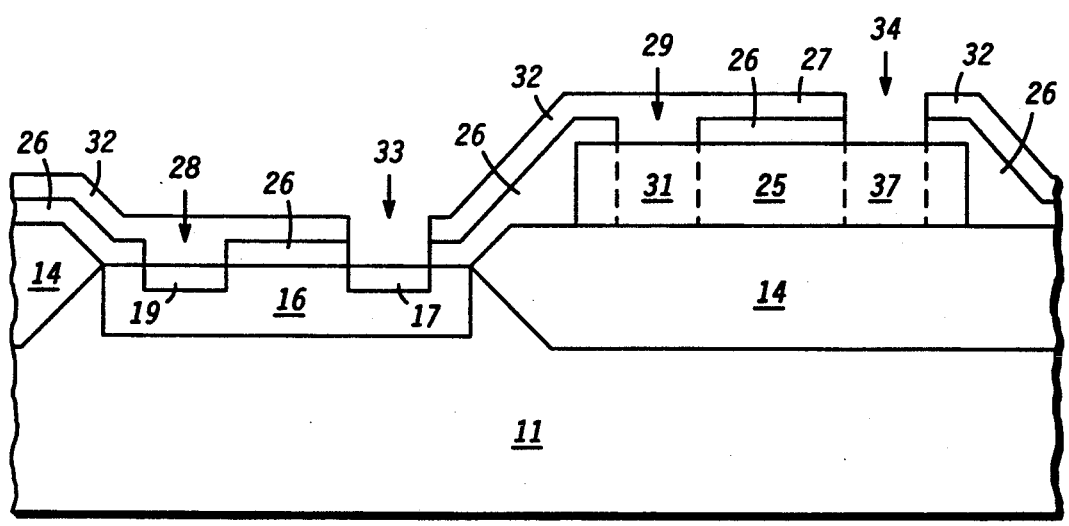

Now referring to FIG. 4, first block-out mask 27 is removed and a second block-out mask 32, of for example photoresist, is formed over dielectric 26 including first master set of openings 28, 29, 33, and 34. Portions of the second block-out mask 32 are removed from second subset of openings 33 and 34; thereby uncovering the second portion of base region 16 and the second portion of the island of polysilicon 25. A second impurity material is provided in the second portion of base region 16 and the second portion of island of polysilicon 25, thereby forming emitter area 17 and diode cathode region 37, respectively. Diode cathode region 37 is shown by dotted lines. The second impurity material, of for example arsenic, may be provided by ion implantation. Second block-out mask 32 is removed. After removal of second block-out mask 32, first master set of openings 28, 29, 33, and 34 are left uncovered.

Figure 5:
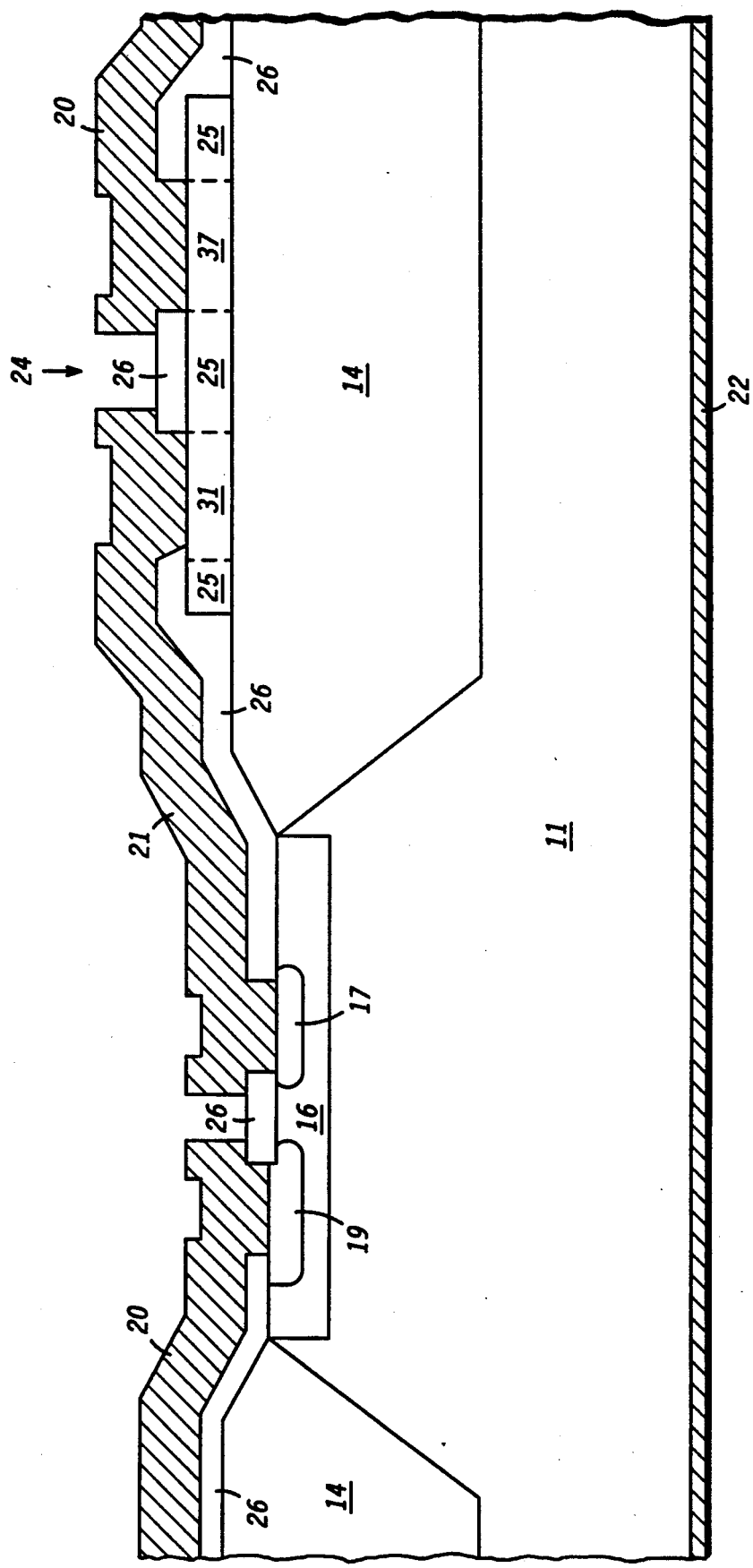
FIG. 5 illustrates a highly enlarged cross-sectional view of a portion of the bipolar transistor of with an input protection device in accordance with the present invention.

Referring now to FIG. 5 and using means well known in the art, base electrode 20 contacts base contact area 19 and diode cathode region 37 such that bipolar transistor base region 16 is electrically coupled to diode cathode region 37; the coupling is shown in FIG. 5 by base electrode 20 contacting base contact area 19 and diode cathode region 37. Further, emitter electrode 21 contacts emitter area 17 and diode anode region 31 such that emitter region 17 is electrically coupled to diode anode region 31. As in prior art bipolar transistor 10, collector electrode 22 contacts the backside surface of substrate 11.

Figure 6:
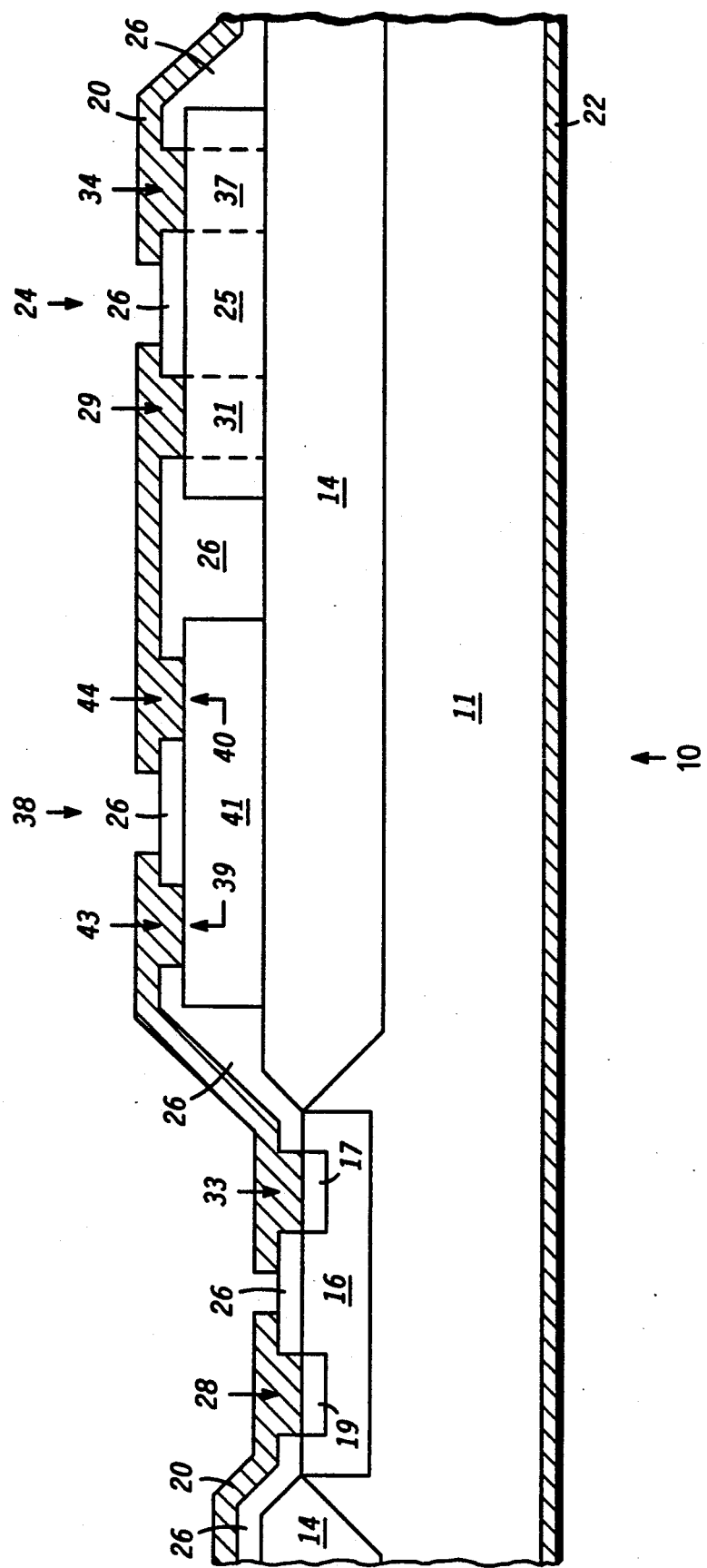
FIG. 6 is an embodiment of FIG. 5 including a polysilicon emitter resistor.

FIG. 6 is a highly enlarged cross-sectional view of a second embodiment of the present invention wherein a polysilicon resistor 38 is in series with the base-emitter junction of bipolar transistor 10. Polysilicon diode 24 is coupled across both polysilicon resistor 38 and the base-emitter junction of bipolar transistor 10 since base electrode 20 coupled to cathode region 37 is also coupled to base contact region 19. Formation of polysilicon diode 24 and polysilicon resistor 38 is incorporated into the standard process used to form bipolar transistor 10.

Incorporating minor modifications into the processing steps of the first embodiment, illustrated in FIGS. 2-5, yields the second embodiment illustrated in FIG. 6. A first island of polysilicon 25 and a second island of polysilicon 41 are formed as described in the discussion of FIG. 2 wherein both islands of polysilicon are adjacent to one another. The polysilicon resistor 38 is formed from second island of polysilicon 41 adjacent to first island of polysilicon 25. Preferably the concentration of the impurity material for the polysilicon resistor implant is selected to provide a resistor value of approximately 25 ohms; although, resistors of other values may be fabricated.

The doping sequence in the formation of second island of polysilicon 41 as taught in the second embodiment of the present invention is not a limitation of the present invention. In other words a region of the layer of polysilicon from which polysilicon resistor 38 is formed may be doped with a dopant concentration to provide the desired resistor value prior to or after the formation of the islands of polysilicon, and initial doping or subsequent doping of the islands of polysilicon may occur during any doping steps in the process for fabricating the structures of the present invention. Further, the resistor may be of N conductivity type or P conductivity type.

In the second embodiment, a second master set of openings 28, 29, 33, 34, 43, and 44 similar to first master set of openings 28, 29, 33, 34 of FIG. 3 is formed in dielectric 26 using means well known in the art. Second master set of openings 28, 29, 33, 34, 43, and 44 includes a third subset of openings 33 and 34 which extends to a first portion and a second portion of island of polysilicon 41. Opening 43 exposes a first terminal region 39 of polysilicon resistor 38 and opening 44 exposes a second terminal region 40 of polysilicon resistor 38. From the formation of the second master set of openings 28, 29, 33, 34, 43, and 44 to removal of second block-out mask 32 the processing steps are the same as those for the first embodiment shown in FIGS. 2-5. It shall be understood that first block-out mask 27 or second block-out mask 32 may be removed from island of polysilicon 41 prior to providing the first impurity material or the second impurity material into anode region 31 or cathode region 37, respectively, in order to provide a desired value for polysilicon resistor 38. Using means well known in the art, base electrode 20 contacts base contact area 19 and diode cathode region 37 such that bipolar transistor base region 16 is electrically coupled to diode cathode region 37 (see FIG. 6). Emitter electrode 21 contacts emitter area 17 and first terminal region 39 such that both regions are electrically coupled to each other. Further, a coupling electrode 45 electrically couples diode anode region 31 to second terminal region 40. The electrical coupling is shown in FIG. 6. As in the embodiment of the present invention shown in FIG. 5, the collector electrode 22 of bipolar transistor 10 contacts the backside surface of substrate 11.

Illustrated in FIG. 7 is a circuit schematic of the first embodiment of the present invention shown in FIG. 5. Bipolar transistor 10 is an NPN transistor and has polysilicon diode 24 coupling a base to an emitter. A first conductor of polysilicon diode 24 is coupled to a base of bipolar transistor 10, and a second conductor of polysilicon diode 24 is coupled to an emitter of bipolar transistor 10.

Illustrated in FIG. 8 is a circuit schematic of the second embodiment of the present invention shown in FIG. 6. Bipolar transistor 10 is an NPN transistor and has a diode connected across a series combination of the base-emitter junction of bipolar transistor 10 and polysilicon resistor 38. The first conductor of polysilicon diode 24 is coupled to the base of bipolar transistor 10. A first terminal of a polysilicon resistor 38 is coupled to the emitter of bipolar transistor 10, and a second terminal of polysilicon resistor 38 is coupled to the second conductor of polysilicon diode 24.

Polysilicon diode 24 serves as an input protection device for microwave bipolar transistor 10, protecting transistor 10 from beta degradation due to the intentional application of large signal swings at the base of transistor 10. Further, polysilicon diode 24 provides protection against the ill-effects of transient signals that may appear at the base of transistor 10.

FIG. 9 provides a top view of a first layout of an embodiment of the present invention having a single polysilicon diode. In the first layout, the island of polysilicon 25 is formed between two transistor regions 47 and 48. A polysilicon diode is fabricated in the island of polysilicon 25. The island of polysilicon 25 is substantially centered between the two transistor regions 47 and 48. Therefore, the polysilicon diode fabricated in the island of polysilicon 25 is substantially centered between transistor regions 47 and 48.

Base electrode 20 is formed as a plurality of base fingers 49, and emitter electrode 21 is formed as a plurality of emitter fingers 50. Each transistor region has a plurality of base fingers 49 interdigitated with a plurality of emitter fingers 50. The fabrication of bipolar transistors as a plurality of transistor regions is a standard technique for increasing the operating current of bipolar transistors and increasing their frequency response.

Bipolar transistor 10 of the present invention is capable of operating in the microwave frequency range; therefore, the layout of bipolar transistor 10, island of polysilicon 25, and the polysilicon diode is critical for optimum performance by transistor 10. The circuitry on each side of island of polysilicon 25 must be identical and substantially symmetric. Further, the polysilicon diode must be substantially centered between each transistor region.

FIG. 10 provides a top view of a second layout of an embodiment of the present invention. In the second layout, a transistor region 51 is formed between two islands of polysilicon 23 and 25. A polysilicon diode is fabricated in each island of polysilicon 23 and 25. The diodes in each island of polysilicon 23 and 25 are electrically connected in parallel. Cathode region 37 of island of polysilicon 25 is electrically coupled to a cathode region 61 of island of polysilicon 23 by base electrode 20. Anode region 31 of island of polysilicon 25 is electrically coupled to an anode region 63 island of polysilicon 62 by emitter electrode 21.

Similar to the first embodiment of FIG. 9, the layout of bipolar transistor 10 and islands of polysilicon 23 and 25 is critical. The transistor region is substantially centered between each island of polysilicon 23 and 25. Moreover, base electrode 20 forms a plurality of base interconnect fingers 49 and emitter electrode 21 forms a plurality of emitter interconnect fingers 50. Base interconnect fingers 49 and emitter interconnect fingers 50 are interdigitated.

FIG. 11 illustrates a permutation to the second diode embodiment wherein two islands of polysilicon 52 and 53, each having a polysilicon diode, are adjacent and substantially centered between transistor regions 47 and 48. A first cathode region 57 is electrically coupled to a plurality of base fingers 49 of transistor regions 47 and 48 by base electrode 20. A first anode region 56 is conductively coupled to a second cathode region 55. A second anode region 54 is conductively coupled to a plurality of emitter fingers 50 of transistor regions 47 and 48 by emitter electrode 21. Although only two islands of polysilicon 52 and 53 containing polysilicon diodes are shown in FIG. 11, it shall be understood the number of islands containing polysilicon diodes is not a limitation of the present invention.

Figure 12:
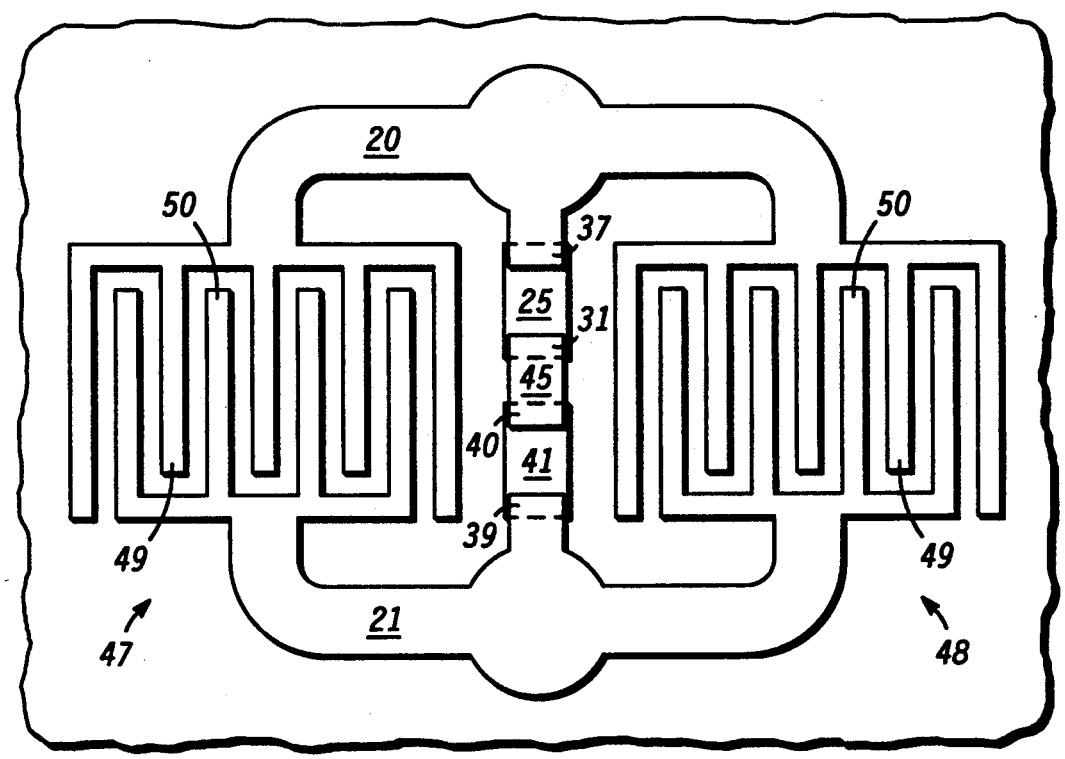
FIG. 12 is a simplified top view illustrating a first layout of an embodiment of the present invention having a polysilicon resistor and a polysilicon diode.

FIG. 12 illustrates a layout of the embodiment shown in FIG. 8. Bipolar transistor base contact region (not shown) is coupled to diode cathode region 37 of island of polysilicon 25, which has polysilicon diode 24, by base electrode 20. Diode anode region 31 of island of polysilicon 25 is coupled to second terminal 40 of island of polysilicon 41, containing polysilicon resistor 38, by coupling electrode 45. First terminal 39 of island of polysilicon 41, containing polysilicon resistor 38, is coupled to emitter resistor 17 (not shown) by emitter electrode 21. It shall be understood that the embodiment as shown in the layouts of FIGS. 9-12 is not limited to the layout having base and emitter fingers. In other words, base electrode 20 and emitter electrode 21 may be realized as electrodes without fingers. However, the centering of diode and transistor regions is critical and must be incorporated into a layout scheme.

By now it should be appreciated that there has been provided an improved method for fabricating bipolar transistors capable of operating in the microwave frequency range. The incorporation of a polysilicon diode across the base-emitter junction mitigates the effects of applying large signal swings or large transient signals at the base of the bipolar transistor. In particular, the inclusion of the polysilicon diode diminishes the degradation of the bipolar transistor beta.

In addition, an improvement in reliability results from diminishing beta degradation. The increased reliability translates into a monetary savings because bipolar transistors do not require replacement as often. Finally, the layout of the bipolar transistor and the polysilicon diodes provides low capacitance input protection devices thereby allowing optimum frequency performance from bipolar transistor circuits employing this technique.

We claim:
1. A method for forming a bipolar transistor having an input protection device, which comprises:
   providing a semiconductor substrate covered by an insulating material;
   forming at least one island of polysilicon over the insulating material;
   implanting a first impurity material of a first conductivity type into the at least one island of polysilicon;
   forming at least one gap in the insulating material wherein the at least one gap exposes a surface of the semiconductor substrate not underneath the at least one island of polysilicon;

forming a bipolar transistor base region in the semiconductor substrate through the at least one gap in the insulating material;

forming a first masking layer wherein the first masking layer covers the at least one island of polysilicon, portions of the insulating material, and the at least one gap in the insulating material;

forming a master set of openings in the first masking layer, the master set of openings exposing a first and a second portion of the bipolar transistor base region and the master set of openings further exposing a first portion and a second portion of the at least one island of polysilicon;

forming a diode anode region in the exposed second portion of the at least one island of polysilicon;

forming a bipolar transistor emitter region in the second portion of the bipolar transistor base region and a diode cathode region in the first portion of the at least one island of polysilicon;

forming an electrode to the bipolar transistor emitter region;

forming an electrode to the bipolar transistor base region wherein the electrode is made through the opening of the master set of openings exposing the first portion of the bipolar transistor base region; and forming a collector electrode to the semiconductor substrate wherein the collector electrode is on a backside surface of the semiconductor substrate.

2. The method for forming the bipolar transistor having the input protection device of claim 1 wherein the step of forming the electrode to the bipolar transistor base region includes forming the electrode to the bipolar transistor base region as a plurality of fingers, and wherein the step of forming the bipolar transistor emitter region includes forming the bipolar transistor emitter region as a plurality of fingers such that the electrode to the bipolar transistor emitter region is a plurality of fingers interdigitated with the plurality of fingers of the bipolar transistor base region.

3. The method for forming the bipolar transistor having the input protection device of claim 1 further including substantially centering the at least one island of polysilicon between two openings in the insulating material wherein the two openings in the insulating material receive the same processing steps as the at least one opening in the insulating material so that the electrodes to the emitter region and the electrodes to the base region are coupled in parallel, respectively.

4. The method for forming the bipolar transistor having the input protection device of claim 1 further including substantially centering the at least one opening in the insulating material between two islands of polysilicon wherein a polysilicon diode is formed in each of the two islands of polysilicon and the diodes are coupled in parallel.

5. The method for forming the bipolar transistor having the input protection device of claim 1 further including forming the bipolar transistor as an NPN transistor having the electrode to the bipolar transistor base region coupled to the diode cathode region and the electrode to the bipolar transistor emitter region coupled to the diode anode region.

6. The method for forming the bipolar transistor having the input protection device of claim 1 further including forming a polysilicon resistor in a second island of polysilicon over the insulating material wherein the polysilicon resistor has a first terminal and a second terminal, the first terminal coupled to the diode anode region and the second terminal coupled to the electrode to the bipolar transistor emitter region.

7. The method for forming the bipolar transistor having the input protection device of claim 5 further including coupling at least two islands of polysilicon in series and across a base-emitter junction of the bipolar transistor, wherein a first of the at least two islands of polysilicon has a diode cathode region coupled to the electrode to the bipolar transistor base region and a last of the at least two islands of polysilicon has a diode anode region coupled to the electrode to the bipolar transistor emitter region.

8. A method for protecting an input to a bipolar transistor capable of operating in the microwave frequency range, which comprises:

providing a bipolar transistor having a bottom collector contact, a first region of interdigitated base and emitter fingers and a second region of interdigitated base and emitter fingers;

forming a polysilicon diode having an anode and a cathode, the polysilicon diode substantially centered between the first and the second regions of the interdigitated base and emitter fingers;

coupling the cathode of the polysilicon diode to the base fingers of the first region of interdigitated base and emitter fingers and to the base fingers of the second region of interdigitated base and emitter fingers; and coupling the anode of the polysilicon diode to the emitter fingers of the first region of interdigitated base and emitter fingers and to the emitter fingers of the second region of interdigitated base and emitter fingers.

9. The method for protecting the input to the bipolar transistor capable of operating in the microwave frequency range of claim 8 further including forming a polysilicon resistor adjacent the polysilicon diode and substantially centered between the first and the second regions of the interdigitated base and emitter fingers wherein the polysilicon resistor has a first end coupled to the anode of the polysilicon diode and a second end coupled to the emitter fingers of both the first and second regions of interdigitated base and emitter fingers.

10. A method of integrating an input protection element with a bipolar transistor, which comprises:

providing a semiconductor material of a first conductivity type having a first dopant concentration covered by an insulating material;

forming at least one region of polysilicon over the insulating material covering the semiconductor material wherein the region of polysilicon is of a second conductivity type having a second dopant concentration;

forming at least one opening in the insulating material which exposes at least one portion of the semiconductor material;

implanting a first impurity material of the second conductivity type and having a third dopant concentration into the at least one opening in the insulating material;

forming a first masking layer over the at least one region of polysilicon, portions of the insulating material, and the at least one opening in the insulating material;

forming a master set of openings in the first masking layer, the master set of openings defining at least one base contact region and at least one emitter region in the at least one opening in the insulating material, and the master set of openings further defining a diode anode region and a diode cathode region in the at least one region of polysilicon;

forming a second masking layer over the first masking layer and the master set of openings;

forming a set of openings in the second masking layer which exposes the at least one base contact region and the diode anode region;

implanting a first impurity material of the second conductivity type of a fourth concentration into the at least one base contact region and the diode anode region;

removing the second masking layer;

forming a third masking layer over the first masking layer and the master set of openings;

forming a set of openings in the third masking layer which exposes the at least one emitter region and the diode cathode region;

implanting the first impurity material of the first conductivity type of a fifth concentration into the at least one emitter region and the diode cathode region;

removing the second masking layer;

coupling the base contact region to the diode cathode region;

coupling the emitter region to the diode anode region; and forming a collector contact to the semiconductor material wherein the contact is on a backside surface of the semiconductor substrate.

11. The method of integrating the input protection element with the bipolar transistor of claim 10 further including providing N conductivity type as the first conductivity type and P conductivity type as the second conductivity type such that the bipolar transistor is an NPN bipolar transistor.

12. The method of integrating the input protection element with the bipolar transistor of claim 10 further including substantially centering the at least one region of polysilicon between two openings in the insulating material, the two openings in the insulating material receiving the same processing steps as the at least one opening in the insulating material.

13. The method of integrating the input protection element with the bipolar transistor of claim 10 further including substantially centering the at least one opening in the insulating material between two regions of polysilicon, the two regions of polysilicon receiving the same processing steps as the at least one region of polysilicon.

14. The method of integrating the input protection element with the bipolar transistor of claim 10 further including forming a second region of polysilicon adjacent to the at least one region of polysilicon wherein the second region of polysilicon has a polysilicon resistor having a first terminal coupled to the diode anode region and a second terminal coupled to the emitter region.

* * * * *